United States Patent
Dainin

(10) Patent No.: US 7,566,607 B2
(45) Date of Patent: Jul. 28, 2009

(54) SEMICONDUCTOR DEVICE AND FABRICATION PROCESS THEREOF

(75) Inventor: Masanori Dainin, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 434 days.

(21) Appl. No.: 10/580,827

(22) PCT Filed: Sep. 28, 2005

(86) PCT No.: PCT/JP2005/018396

§ 371 (c)(1),
(2), (4) Date: May 26, 2006

(87) PCT Pub. No.: WO2006/036000

PCT Pub. Date: Apr. 6, 2006

(65) Prior Publication Data

US 2007/0128790 A1 Jun. 7, 2007

(30) Foreign Application Priority Data

Sep. 30, 2004 (JP) .............................. 2004-289182

(51) Int. Cl.
*H01L 21/8238* (2006.01)
*H01L 27/088* (2006.01)

(52) U.S. Cl. .................. 438/210; 438/238; 438/384; 257/379; 257/380; 257/E27.035

(58) Field of Classification Search ................ 438/585, 438/200, 210, 132, 624, 384; 257/379, 529, 257/380
See application file for complete search history.

(56) References Cited

U.S. PATENT DOCUMENTS 5,812,364 A * 9/1998 Oku et al. .................. 361/312
2002/0180453 A1* 12/2002 Itoh .......................... 324/525
2005/0051899 A1* 3/2005 Nakatani et al. ............ 257/751

FOREIGN PATENT DOCUMENTS

| EP | 1310998 A2 | 5/2003 |
|---|---|---|
| JP | 6-112410 A | 4/1994 |
| JP | 9-17860 A | 1/1997 |
| JP | 2000-340562 | 12/2000 |
| JP | 3195828 B2 | 6/2001 |
| JP | 2001-284464 A | 10/2001 |
| JP | 2003-152100 A | 5/2003 |
| JP | 2004-146548 A | 5/2004 |

OTHER PUBLICATIONS

Lifshitz, Nadia, "Dependence of the Work-Function Difference Between the Polycilicon Gate and Silicon Substrate on the Doping Level in Polysilicon", IEEE Transactions on Electron Devices, vol. ed. 32, No. 3, Mar. 1985, pp. 617-621.

* cited by examiner

*Primary Examiner*—Michael Trinh
(74) *Attorney, Agent, or Firm*—Dickstein Shapiro LLP

(57) ABSTRACT

A semiconductor device includes a semiconductor substrate, a polysilicon pattern formed on the semiconductor substrate via an insulation film, an interlayer insulation film formed on the semiconductor substrate so as to cover the polysilicon pattern, and a metal interconnection layer pattern formed on the interlayer insulation film, wherein the metal interconnection layer pattern carrying silicon nitride films respectively on a top surface, a bottom surface and sidewall surfaces thereof.

11 Claims, 14 Drawing Sheets

SEMICONDUCTOR DEVICE AND FABRICATION PROCESS THEREOF

TECHNICAL FIELD

The present invention generally relates to semiconductor devices and more particularly to a semiconductor device including therein a polysilicon pattern used for resistance and/or gate electrode and the fabrication process thereof.

BACKGROUND ART

In recent years, there is an increasing demand of improved device characteristics particularly in the field of analog integrated circuit devices. For example, there is a stringent demand in analog semiconductor integrated circuit devices for high precision of operational characteristics particularly in terms of threshold voltage and resistance values, in view of the fact that analog semiconductor integrated circuit devices have to guarantee high stability and controllability with regard to the threshold characteristics for the transistors formed therein and with regard to the resistance values for the resistance elements therein. Particularly, stable transistor characteristics and stable resistance values over long period of time are important in high precision analog semiconductor integrated circuit devices.

Meanwhile, a multilayer interconnection structure is used extensively these days in highly miniaturized semiconductor integrated circuit devices for electrical interconnection between semiconductor elements formed therein. In multilayer interconnection structure, interconnection patterns are formed in number of layers stacked with each other with intervening interlayer insulation films or SOG (spin-on-glass) films, wherein the interlayer insulation films are provided for electrical insulation between the interconnection patterns and for providing a planarized surface for formation of next interconnection patterns by burying the interconnection patterns of the current layer therein.

It is known that these interlayer insulation films contain a large amount of hydrogen and water in relation to the process of formation thereof. Thus, when such hydrogen or water is released from the interlayer insulation film with heat treatment conducted during the fabrication process of the semiconductor integrated circuit device and the released hydrogen or water molecules have reached the underlying polysilicon pattern forming a resistance element or gate electrode of a transistor, there is caused a substantial variation in the resistance value for the resistance element or threshold voltage for the transistor.

It is noted that when hydrogen molecules or water molecules thus released are trapped by the grain boundary of the polysilicon patterns, there would be caused significant modification in the characteristics of the resistance element or gate electrode of polysilicon due to the modified barrier height at the grain boundaries, while such modification of barrier height leads to increase or decrease of carrier concentration level in the polysilicon pattern. Because the influence caused by hydrogen or water depends on the concentration level of the impurity element introduced into the polysilicon pattern, the degree of the influence depends on the resistance value desired for the polysilicon pattern. Further, the amount of hydrogen incorporated into a polysilicon pattern depends on whether or not the polysilicon pattern is disposed right underneath a metal interconnection pattern functioning as a hydrogen barrier.

Patent Reference 1 discloses a voltage generation circuit that includes therein plural MOS (metal-oxide-semiconductor) transistors each having a polysilicon gate electrode. In Patent Reference 1, the MOS transistors have a common carrier concentration level among the source regions, the drain regions and the channel regions, and voltage is produced by using the difference of work function between different gate electrodes formed with respective, different impurity concentration levels and/or with respective, different conductivity types.

Patent Reference 1 relates to a MOS transistor circuit operating stably at high temperatures, wherein it should be noted, with such a circuit using polysilicon gate for the MOS transistors, the variation of resistance value of the gate electrode induces variation of threshold characteristics of the MOS transistors.

Further, with such a circuit, there is provided a resistance body formed of a polysilicon pattern, wherein such a polysilicon pattern used for a resistance body has an impurity concentration level different from the impurity concentration level of the polysilicon patterns used for the gate electrode. Thus, the influence of hydrogen during the fabrication process is different between different polysilicon patterns.

Non-Patent Reference 1 discloses the energy band of the gate electrode formed of a polysilicon pattern, wherein Non-Patent Reference 1 describes the relationship between the impurity concentration level (carrier concentration level) in the gate electrode of a MOS structure and the work function of the substrate.

According to Non-Parent Reference 1, there occurs an increase of work function with increase of carrier concentration level and the work function takes a maximum value when the impurity concentration level has reached the value of $5 \times 10^{19}$ cm$^{-3}$. When the impurity concentration level exceeds the foregoing value, on the other hand, there occurs a decrease in the work function. In the state in which the impurity concentration in the polysilicon pattern is smaller than the foregoing value of $5 \times 10^{19}$ cm$^{-3}$ and thus the polysilicon pattern has an increased resistance value, there is a tendency that hydrogen atoms are easily trapped at the grain boundary, leading to large variation of the resistance value.

Similar variation of resistance value occurs also in the case the polysilicon pattern is used for a resistance element.

In relation to the case of using a polysilicon pattern having such an impurity concentration level that can experience heavy influence of hydrogen, there is proposed a technology for suppressing the effect of hydrogen on the resistance value during the device fabrication process for example as set forth in Patent Reference 2, in which a plasma nitride film and a metal interconnection pattern are disposed over the resistance value with the same ratio of coverage area.

Further, there is disclosed a method of covering a region of the resistance body by a metal interconnection layer pattern such that the effect of hydrogen to the polysilicon resistance body from the plasma nitride film formed thereon is interrupted. Reference should be made to Patent Reference 3.

However, none of these prior art allows sufficient degree of freedom for disposing a metal interconnection layer pattern on the polysilicon resistance body, and there has been a problem in that the area over the resistance body cannot be used for providing interconnection patterns.

Further, there has also been a problem, in the case of using plural polysilicon patterns of mutually different impurity concentration levels for the polysilicon resistance body, in that the degree of the influence of hydrogen changes depending on the impurity concentration level of the polysilicon patterns.

REFERENCES

PATENT REFERENCE 1 Japanese Laid-Open Patent Application 2001-284464 Official Gazette
PATENT REFERENCE 2 Japanese Laid-Open Patent Application 6-112410 Official Gazette
PATENT REFERENCE 3 Japanese Patent 3,195,828
PATENT REFERENCE 4 Japanese Laid-Open Patent Application 2003-152100
NON-PATENT REFERENCE 1 Dependence of the Work-Function Difference between the Polysilicon Gate and Silicon Substrate on the Doping Level in Polysilicon (IEEE 1985)

DISCLOSURE OF THE INVENTION

As noted above, there has been a problem in polysilicon resistance bodies or polysilicon gate electrode of MOS transistors in that the resistance value thereof changes with time or changes during the fabrication process of the device because of release of hydrogen gas or water from the interlayer insulation films and because of the fact that the degree of change of the resistance value depends on whether or not there is provided a metal interconnection pattern on the polysilicon resistance body or polysilicon gate electrode. When such a change of resistance value takes place, there occurs a problem in that the resistance value of the resistance body or the threshold value of the MOS transistor changes unwontedly.

Further, there has been a problem of limited degree of freedom of design in conventional art in that it is not possible to use the region over the polysilicon pattern freely for the interconnection patterns in view of the fact that conventional art prohibits formation of metal interconnection layer pattern over the polysilicon pattern or avoids overlapping of the polysilicon pattern with the metal interconnection layer pattern pattern provided over the polysilicon pattern.

It is the object of the present invention to provide a semiconductor device and fabrication process thereof in which it is possible to dispose a metal interconnection layer pattern over a polysilicon pattern while controlling the resistance value of the polysilicon pattern.

The present invention provides a semiconductor device, comprising:
a semiconductor substrate;
a polysilicon pattern formed on said semiconductor substrate via an insulation film;
an interlayer insulation film formed on said semiconductor substrate so as to cover said polysilicon pattern; and
a metal interconnection layer pattern formed on said interlayer insulation film,
wherein said metal interconnection layer pattern carrying silicon nitride films respectively on a top surface, a bottom surface and sidewall surfaces thereof.

According to the present invention, it becomes possible to achieve the same resistance value for various polysilicon patterns, irrespective of whether or not there is provided a metal interconnection layer pattern over the polysilicon patterns.

In a preferred embodiment, the silicon nitride films comprises a first nitride film formed on a surface of the interlayer insulation film and in contact with a bottom surface of the metal interconnection layer pattern, and a second nitride film covering the sidewall surfaces and top surface of the metal interconnection layer pattern. Thereby, the first nitride film and said second nitride film may have respective, different thicknesses.

Further, in a preferred embodiment, there may be provided a region where the first nitride film and the second nitride film are removed except for the first nitride film underlying the metal interconnection layer pattern.

Further, the semiconductor device may include a p-channel MOS transistor having a gate electrode formed of the polysilicon pattern such that formation of the metal interconnection layer pattern, the first nitride film and the second nitride film us suppressed in a region over the p-channel MOS transistor.

Further, it is possible to provide a laminated film between the polysilicon pattern and the interlayer insulation film such that the laminated film includes, consecutively from the side of the polysilicon pattern, an oxide film and a third nitride film.

Further, it is possible that the semiconductor device includes a p-channel MOS transistor having the foregoing polysilicon pattern as a gate electrode, such that the foregoing third nitride film is formed on the p-channel MOS transistor.

In one example, the present invention provide a semiconductor device having a voltage divider circuit forming an output voltage by dividing a voltage supplied thereto by two or more resistance elements, the voltage divider circuit being capable of adjusting an output voltage by disconnection of a fuse element, wherein the polysilicon pattern as set forth before is used for the resistance element.

In another example, the present invention provides a semiconductor device comprising a voltage divider circuit producing a divided voltage output by dividing an input voltage, a reference voltage generator producing a reference voltage, and a voltage detection circuit including a comparator circuit comparing the divided voltage output of the voltage divider circuit and the reference voltage of the reference voltage generator, wherein the voltage divider circuit includes a polysilicon pattern as set forth above.

A further example of the semiconductor device of the present invention includes an output driver controlling output of an input voltage, a voltage divider circuit dividing an output voltage and producing a divided voltage, a reference voltage generator producing a reference voltage, and a constant voltage generator including a comparator circuit for controlling the output driver in response to the result of comparison, wherein the polysilicon pattern of the present invention is used for the voltage divider circuit.

Further, according to the fabrication process of the semiconductor device of the present invention, there are provided the steps of: forming a polysilicon pattern on a semiconductor substrate via an insulation film; forming an interlayer insulation film on the semiconductor substrate so as to cover the polysilicon pattern; forming a first nitride film on the interlayer insulation film; forming a metal interconnection layer pattern on the first nitride film; and forming a second nitride film on the first nitride film so as to cover the metal interconnection layer.

According to the fabrication process of the present invention, there may be provided a step of removing, after the step of forming the second nitride film, the second nitride film and the first nitride film selectively from a predetermined region.

According to the semiconductor device of the present invention, in which the metal interconnection layer pattern formed on the interlayer insulation film over the polysilicon pattern is covered by a silicon nitride film, it becomes possible to achieve the same resistance value for various polysilicon patterns, irrespective of whether or not there is provided a metal interconnection layer pattern over such a polysilicon pattern. Thereby, it becomes possible to dispose the metal interconnection layer pattern freely over the polysilicon patterns while controlling the resistance value of the polysilicon patterns as desired.

Further, by forming the silicon nitride film such that a first nitride film contact to the bottom surface of the metal interconnection layer pattern and the second nitride film covers the sidewall surfaces and the top surface of the metal interconnection pattern, it becomes possible to change the thickness of the nitride film between the first nitride film and the second nitride film. Thereby, it becomes possible to select the film thickness ratio between the first nitride film and the second nitride film in conformity with the impurity concentration level of the polysilicon pattern. With this, it becomes possible to form a polysilicon resistance pattern or gate electrode pattern, irrespective of the impurity concentration level therein and irrespective of whether or not there is formed a metal interconnection layer pattern over the polysilicon pattern.

Further, by removing the first nitride film and the second nitride film surrounding the metal interconnection layer pattern except for the first nitride film underneath the metal interconnection layer, it becomes possible to change the resistance value between the polysilicon pattern disposed with such a construction and the polysilicon pattern where the first and second nitride films are formed, even in the case the same impurity concentration level is used for these polysilicon patterns.

Further, while it is known that a p-channel MOS transistor has a problem that the threshold characteristics tend to become unstable unless the trapping levels existing at the gate/oxide interface are stabilized at the time of metal alloying process conducted immediately after formation of the metal interconnection layer pattern (see Patent Reference 4), the present invention successfully avoid deterioration of threshold controllability of the p-channel MOS transistors that uses the foregoing polysilicon patterns for the electrode, by disposing the p-channel MOS transistors in the region where the first and second nitride films are removed.

Further, by constructing the semiconductor device such that the foregoing polysilicon pattern is used for the gate electrode of the p-channel MOS transistor and such that none of the foregoing metal interconnection layer, the first nitride film and the second nitride film is formed on the p-channel MOS transistor, it becomes possible to stabilize the trapping levels, and the problem of poor threshold controllability of p-channel MOS transistors is successfully avoided.

Further, by providing a laminated film between the polysilicon pattern and the interlayer insulation film with the order of oxide film and third nitride film from the side closer to the polysilicon pattern, it becomes possible to prevent diffusion of hydrogen to the polysilicon pattern by the third nitride film, and good stability is achieved for the resistance value of the polysilicon pattern.

Further, by suppressing formation of the third nitride film, in the case of the structure that uses such a third nitride film, from the region above the p-channel MOS transistor that uses the polysilicon pattern as the gate electrode, good stability is achieved for the trapping levels and good threshold control is achieved for the p-channel MOS transistor.

Further, with the semiconductor device having a voltage divider circuit that obtains the voltage output by dividing a voltage by two or more resistance elements and is capable of adjusting the voltage output by disconnection of the fuse element, it becomes possible, by forming the resistance element by the polysilicon pattern of the present invention, to dispose the metal interconnection pattern on the polysilicon pattern while controlling the resistance value of the polysilicon pattern. Thereby, the degree of freedom of design is improved.

Further, in a semiconductor device having a voltage divider circuit supplying a divided voltage by dividing an input voltage, a reference voltage generator generating a reference voltage and a comparator circuit comparing the divided voltage from the voltage divider circuit and the reference voltage from the reference voltage generator, it becomes possible, by providing a voltage divider circuit that uses the polysilicon pattern of the present invention as the voltage divider, to increase the degree of freedom of design.

Further, with the semiconductor device of the present invention including the output driver for controlling output of an input voltage, the voltage divider circuit for dividing an output voltage and producing a divided voltage, the reference voltage generator for producing a reference voltage, and the constant voltage generator including a comparator circuit for controlling the output driver in response to the result of comparison, wherein the polysilicon pattern of the present invention is used for the voltage divider circuit, it becomes possible, by providing the voltage divider circuit such that the voltage divider therein uses the polysilicon pattern of the present invention, it becomes possible to increase the degree of freedom of design.

Further, according to the fabrication process of the semiconductor device of the present invention, in which there are provided the steps of: forming a polysilicon pattern on a semiconductor substrate via an insulation film; forming an interlayer insulation film on the semiconductor substrate so as to cover the polysilicon pattern, forming a first nitride film on the interlayer insulation film, forming a metal interconnection layer pattern on the first nitride film, and forming a second nitride film on the first nitride film so as to cover the metal interconnection layer, it becomes possible to achieve the same resistance value for the polysilicon patterns, irrespective of whether there is disposed a metal interconnection layer pattern thereabove or not. Thereby, it becomes possible to dispose a metal interconnection layer pattern on the polysilicon pattern while controlling the resistance value of the polysilicon pattern. Further, it is possible to change the film thickness of the first nitride film and the second nitride film, and it becomes possible to choose the ratio of film thickness between the first nitride film and the second nitride film according to the impurity concentration level of the polysilicon pattern. With this, it becomes possible to form the polysilicon patterns not affected by the existence or non-existence of the metal interconnection layer pattern thereon, irrespective of the impurity concentration level in the polysilicon patterns.

Further, with the fabrication process of the semiconductor device according to the present invention, it becomes possible, by providing the process of removing the second nitride film and the first nitride film from a predetermined region after formation of the second nitride film, to realize different resistance values for the polysilicon pattern disposed in the region where the first and second nitride films are removed and the polysilicon pattern disposed to the region where both the first and second nitride films exist, even in the case both polysilicon patterns have the same impurity concentration level. Thereby, it should be noted that there occurs no degradation of threshold voltage controllability for the p-channel MOS transistor that uses the polysilicon pattern for the gate electrode, by disposing the p-channel MOS transistor to the region where the first nitride film and the second nitride film are removed.

Other objects, features and advantages of the present invention will become more apparent from the following detailed description when read in conjunction with the accompanying drawings.

BEST MODE FOR CARRYING OUT THE INVENTION

First Embodiment

Figure 1:
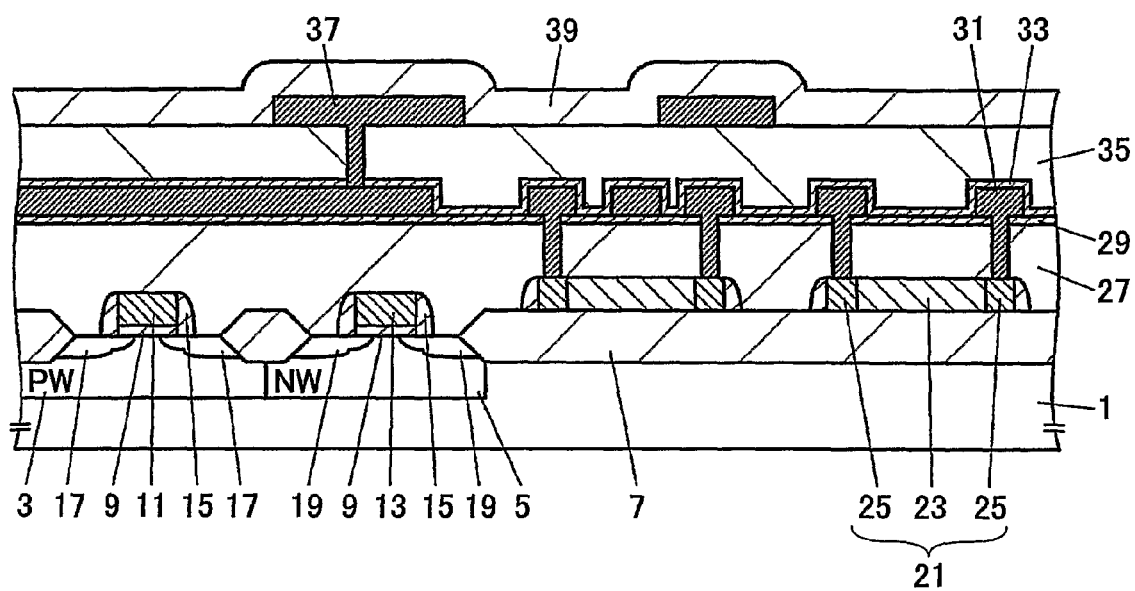
FIG. 1 is a cross-sectional diagram showing an embodiment of the semiconductor device of the present invention.

FIG. 1 is a cross-sectional diagram showing an embodiment of the semiconductor device according to an embodiment of the present invention.

Referring to FIG. 1, the semiconductor device is constructed on a silicon substrate 1 (semiconductor substrate) of p-type and includes a p-type well region (PW) 3 introduced with a p-type impurity element and an n-type well region (NW) 5 in which an n-type impurity element is introduced, wherein the p-type well region 3 and the n-type well region 5 are separated from each other by a device isolation oxide 7 formed on the surface of the silicon substrate 1 with large thickness.

On the p-type well region 3, there is formed a gate electrode 11 of a polysilicon film doped to an $n^+$-type by incorporation of an n-type impurity element with an intervening gate oxide film 9 having a thickness of about 15 nm (nanometers).

Similarly, there is formed a gate electrode 13 of a polysilicon film on the n-type well 5 via the gate oxide film 9 wherein the polysilicon film forming the gate electrode 13 is doped to a $p^+$-type by incorporation of a p-type impurity element.

Typically, the gate electrode 11 of $n^+$-type and the gate electrode 13 of $p^+$-type are formed with the thickness of about 400 nm. Further, sidewall insulation films 15 are formed at the respective lateral sidewall surfaces of the gate oxide film 9, the gate electrode 11 and the gate electrode 13.

In the p-type well region 3, there are formed a pair of n-type diffusion regions 17 forming an LDD (lightly doped drain) across the gate electrode 11, wherein the gate oxide film 9, the gate electrode 11 and the n-type diffusion regions 17 form together an n-channel MOS transistor in the p-type well region 3. Further, it should be noted that channel doping is made to the part of the p-type well region 3 right underneath the gate electrode 11 for the purpose of threshold control.

Similarly, there are formed a pair of p-type diffusion regions 19 forming an LDD (lightly doped drain) across the gate electrode 13 of $p^+$-type in the n-type well region 5, wherein the gate oxide film 9, the gate electrode 13 and the p-type diffusion regions 19 form together a p-channel MOS transistor in the n-type well region 5. Further, it should be noted that channel doping is made to the part of the n-type well region 5 right underneath the gate electrode 13 for the purpose of threshold control.

It should be noted that the device isolation film 7 carries thereon a resistance element 21 formed of a polysilicon pattern, wherein the resistance element 21 comprises a polysilicon resistance body 23 introduced with an n-type impurity element with a concentration level determined by a desired resistance value. Further, there are provided low resistance polysilicon films 25 doped with the n-type impurity element with high concentration level at both ends of the resistance body 23.

Further, there is formed an interlayer insulation film 27 on the entirety of the silicon substrate 1 such that the interlayer insulation film 27 covers both the n-channel MOS transistor and the p-channel MOS transistor and the resistance element 21 on the device isolation film 7, wherein the interlayer insulation film 27 comprises an NSG (non-doped silicate glass) film having a thickness of 300 nm and a BPSG (boro-phosphosilicate glass) having a thickness of 500 nm. The interlayer insulation film 27 thus formed has a planarized top surface, while it should be noted that planarized top surface of the interlayer insulation film 27 is not the essential factor of the present invention. In FIG. 1, the NSG film and the BPSG film are indicated as a single layer. Further, it should be noted that the interlayer insulation film 27 is not limited to such a laminated film of NSG film and BPSG film but it is possible to use other insulation film or films in the form of a single-layer film or laminated film. For example, it is possible to form the interlayer insulation film 27 as a lamination of an NSG film and a PSG (phosphosilicate glass) film.

On the interlayer insulation film 27, it should be noted that there is formed a first nitride film 29 with a thickness of 20 nm, for example, and the interlayer insulation film 27 and the first nitride film 29 are formed with contact holes respectively in correspondence to the gate electrodes 11 and 13, the diffusion regions 17 and 19 and the polysilicon films 15 for the purpose of electrical interconnection. It should be noted that representation of some contact holes is omitted in FIG. 1.

Thus, there is provided a first metal interconnection layer pattern 31 on the first nitride film 29 so as to fill the contact holes thus formed, wherein the first metal interconnection layer pattern 31 has a laminated structure in which a barrier metal layer of Ti or the like having a thickness of about 40 nm and an Al layer or an Al alloy layer having a thickness of 80-100 nm are stacked consecutively from the bottom part thereof to the top part thereof. Here, it should be noted that the material of the first metal interconnection layer pattern 31 is not limited to the foregoing, and it is also possible to use a laminated film of Al, AlCu, AlSi, Cu, or the like, and Ti, TiN, TiW, W, and the like. Further, it is possible to use a single-layer film of any of the foregoing.

On the interlayer insulation film 27 and the first metal interconnection layer pattern 31, there is formed a second nitride film 33 with a thickness of 60 nm, for example. Thus, the thickness of the first nitride film 29 and the thickness of the second nitride film 33 are different with the present embodiment, while this is not essential to the present invention and it is possible to form the first and second nitride films 29 and 33 to have the same film thickness.

On the second nitride film 33, there is formed a metal-metal interlayer insulation film 35 in the form of lamination of a TEOS (tetraethyl orthosilicate) layer and an SOG (spin-on-glass) layer formed thereon. Further, the interlayer insulation film 35 is formed with a through hole in a region over the first metal interconnection layer pattern 31 for electrically connecting the first metal interconnection layer pattern 31 to a second metal interconnection layer pattern 37 formed on the interlayer insulation film 35. It should be noted that FIG. 1 does not represent all of the through holes formed in the interlayer insulation film 35. Here, it should be noted that the interlayer insulation film 35 is not limited to the laminated film of TEOS and SOG but it is possible to use an interlayer insulation film of other construction such as the one carrying an insulation film such as a TEOS film, an NSG film or a BPSG film on an SOG film.

Further, a second metal interconnection layer pattern 37 is formed in the interlayer insulation film 35 so as to fill the through-holes formed therein in the form of an AlSiCu layer having a thickness of about 1500 nm. Further, a plasma nitride film 39 is formed on the interlayer insulation film 35 so as to cover the second metal interconnection layer pattern 37 as a passivation film with the thickness of about 100 nm.

FIGS. 2A-2E show the fabrication process of the semiconductor device of FIG. 1.

Figure 2A:
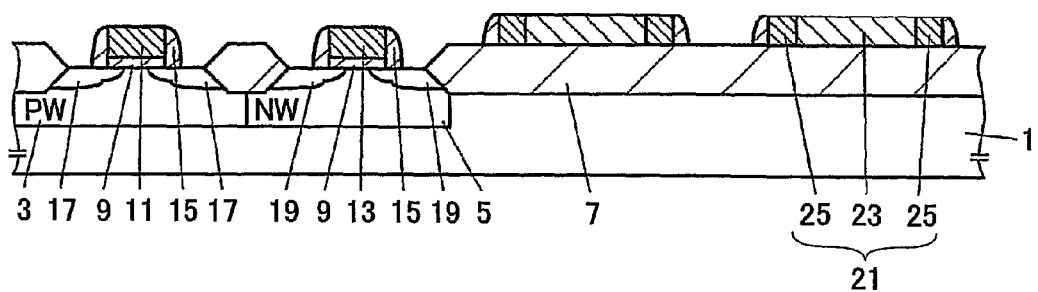
FIGS. 2A-2E are cross-sectional diagrams showing the fabrication process of the semiconductor device according to an embodiment of the present invention.

(1) Referring to FIG. 2A, the p-type well region 3 is formed in the silicon substrate 1 in correspondence to the region where the n-channel MOS transistor is to be formed. Similarly, the n-type well region 5 is formed in the silicon substrate 1 in correspondence to the region where the p-channel MOS transistor is to be formed. Further, a device isolation oxide 7 is formed on the surface of the silicon substrate 1 in the form of a thick oxide film according a well-known LOCOS (local oxidation of silicon) process after formation of the n-type well 5 for the p-channel MOS transistor.

Further, the gate oxide film 9 is formed on the surface of the p-type well region 3 and the surface of the n-type well region 5 with a thickness of about 15 nm, and an undoped polysilicon film is deposited on the entire surface of the silicon substrate 1 thus formed with the gate oxide film 9 by a low-pressure CVD process, or the like, with the thickness of about 400 nm, wherein the undoped polysilicon film thus deposited is subjected to a subsequent patterning process, and with this, polysilicon patterns for the gate electrodes and resistance elements are formed. Further, photolithography and ion implantation are conducted and the LDD parts are formed in the n-type diffusion regions 17 and the p-type diffusion regions. Further, the resistance body 23 is formed as a result of such an ion implantation process.

Further, the sidewall insulation films 15 are formed by a deposition and etchback process of an oxide film, and the gate electrode 11 is doped to the $n^+$-type by photolithography and ion implantation process. At the same time, the n-type diffusion regions 17 are doped to the $n^+$-type in the parts thereof located outside the LDD regions. Similarly, the gate electrode 13 is doped to the $p^+$-type by photolithography and ion implantation process, and at the same time, the p-type diffusion regions 19 are doped to the $p^+$-type in the parts thereof located outside the LDD regions. Further, the low resistance regions 25 are formed in the polysilicon pattern 21.

Next, an ion implantation process is conducted for introducing an impurity element for controlling the resistance value into the region of the polysilicon film forming the resistance body 23. For example, in the case of adjusting the resistivity of the polysilicon pattern to 10 k$\Omega$/□ by incorporation of P, which is an n-type impurity element, ion implantation with the dose of $3.0 \times 10^{14}$-$6.0 \times 10^{14}$/cm$^{-2}$ is needed. Further, in the case of adjusting the resistivity of the polysilicon pattern to 2 k$\Omega$/□ by incorporation of P, ion implantation with the dose of $1.0 \times 10^{15}$-$1.5 \times 10^{15}$/cm$^{-2}$ is needed.

Further, the resistance body 23 can be formed also by a polysilicon pattern introduced with a p-type impurity element. In such a case, boron may be introduced as the p-type impurity element. Control of the impurity concentration level of the resistance body 23 may be conducted simultaneously to the ion implantation process for forming the LDD regions in the diffusion regions 17 of n-type or the diffusion regions 19 of p-type. Alternately, it is possible to achieve such control by using a dedicated ion implantation process. Further, it is possible to achieve control of the impurity concentration level of the resistance body 23 by conducting the ion implantation process before patterning the polysilicon film.

Figure 2B:
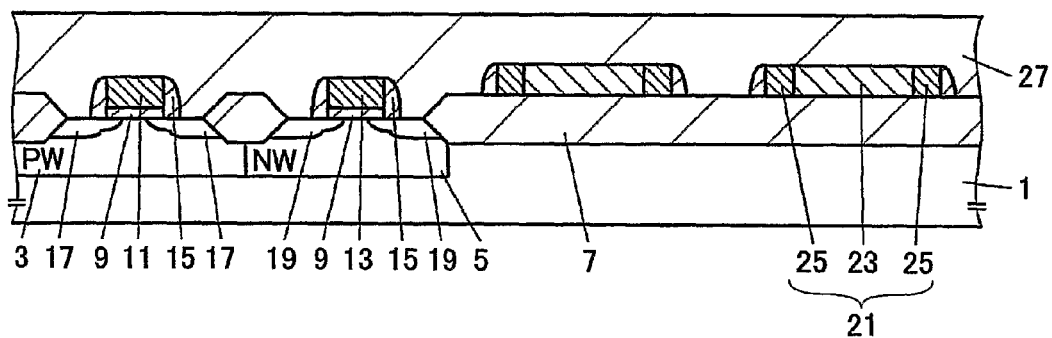

(2) Next, in the step of FIG. 2B, an NSG film is deposited on the entire surface of the silicon substrate 1 with a thickness of about 300 nm, and a BPSG film is deposited further thereon with a thickness of about 500 nm. Thereby, an interlayer insulation film 27 is formed.

Thereafter, a thermal annealing process is applied with a temperature of 800-900° C. and planarization is conducted form the interlayer insulation film 27. Here, it is also possible to apply a planarization film such as an SOG on the interlayer insulation film 27 for improving planarization.

Figure 2C:
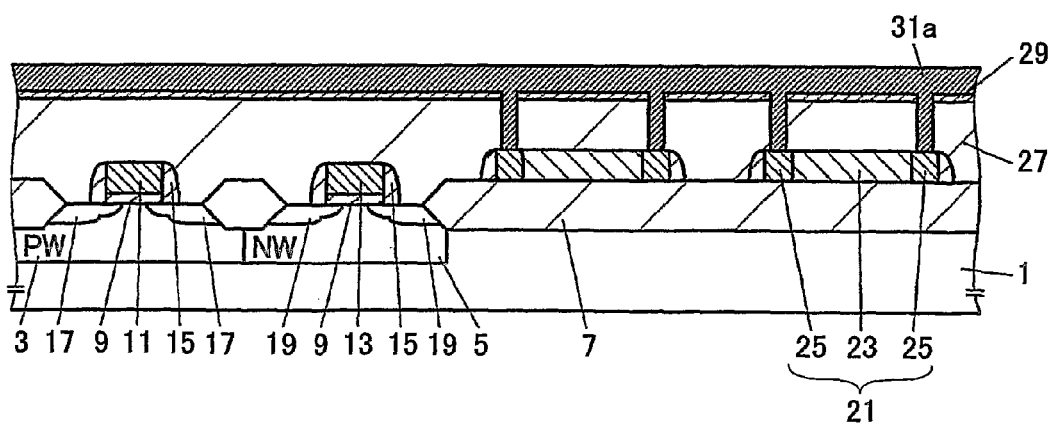

(3) Next, in the step of FIG. 2C, the first nitride film 29 is formed on the interlayer insulation film 29 with a thickness of 20 nm, for example, wherein the first nitride film 29 may be formed by a low-pressure CVD process conducted at the temperature of about 700° C. while using $SiH_2Cl_2$ or $NH_3$ as a source gas.

Next, by using a photolithographic process and etching process, contact holes are formed in the first nitride film 29 and the interlayer insulation film 27 at respective, predetermined regions. Here, it is possible to etch the first nitride film 29 and the interlayer insulation film 27 simultaneously by an ECR (electron cyclotron resonance) plasma etching process while using $CF_4$ and $CHF_3$ for the etching gas, and the contact holes can be formed without extra process steps.

Further, a barrier metal of Ti, or the like, is deposited on the first nitride film 29 including the contact hole with a thickness of about 40 nm, followed by deposition of an aluminum alloy containing Cu or the like thereon by a sputtering process with the thickness of 800-1000 nm. Thereby, a laminated metal film 31a is obtained.

Figure 2D:
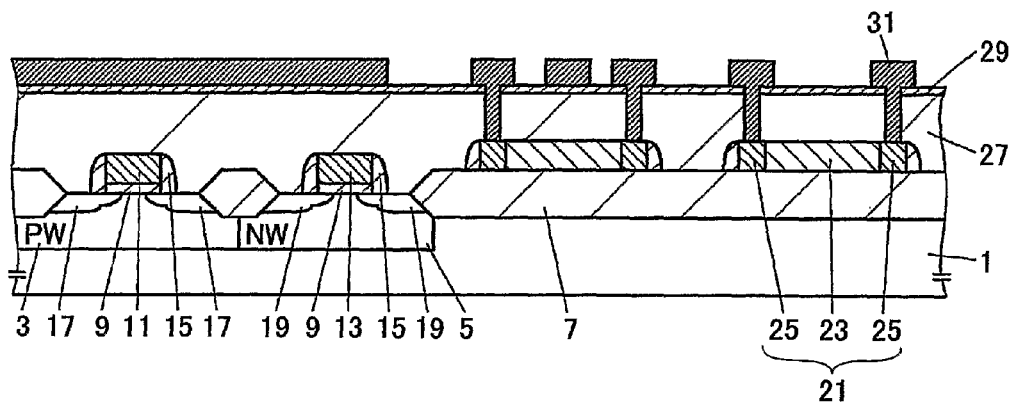

(4) Next, in the step of FIG. 2D, the laminated metal film 31a is patterned by photolithography and etching, and with this, formation of the first metal interconnection layer pattern 31 is achieved.

Here, the etching may be conducted by ECR process while using $BCl_3$ and $Cl_2$ as the etching gas. In this etching process, it is possible to set the etching condition such that the first nitride film 29 is left only in the part located underneath the first metal interconnection layer pattern or such that the first nitride film 29 is left on the entire surface of the interlayer insulation film 27 as in the case of the illustrated example.

Figure 2E:
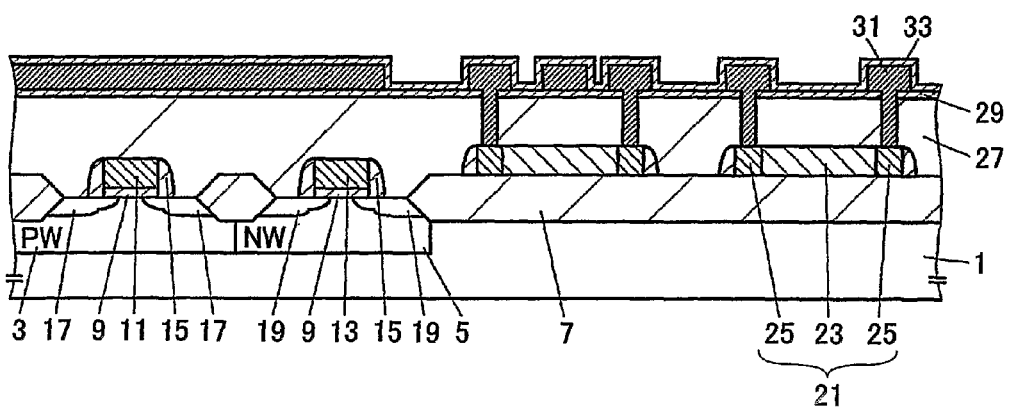

(5) Next, in the step of FIG. 2E, the second nitride film 33 is formed on the first nitride film 29 and the first metal interconnection layer pattern 31 with the thickness of 60 nm, for example. It should be noted that formation of such a second nitride film 29 may be conducted by a low-pressure CVD process conducted at the temperature of about 700° C. while supplying $SiH_2Cl_2$ and $NH_3$ as the source gas.

With such an embodiment, it is possible to change the thickness of the nitride film underneath the first metal interconnection layer pattern 31 from the region where the first nitride film 29 and the second nitride film 33 are laminated.

(6) Thereafter, a TEOS film is deposited on the second nitride film 22 by a plasma CVD process, followed by planarization process by forming an SOG film thereon. With this, the interlayer insulation film 35 shown in FIG. 1 is obtained.

Next, the through-holes are formed in the interlayer insulation film 35 in the predetermined region above the first metal interconnection pattern, wherein the second metal interconnection layer pattern 35 is formed on the interlayer insulation film 35 including the through-holes, by first depositing an AlSiCu film by a sputtering process with the thickness of about 1500 nm, followed by patterning the AlSiCu film thus deposited by photolithography and etching process. With this, the second metal interconnection layer pattern 37 is formed.

Finally, the plasma nitride film 39 is formed as a passivation film as shown in FIG. 1 with the thickness of about 100 nm.

Figure 3:
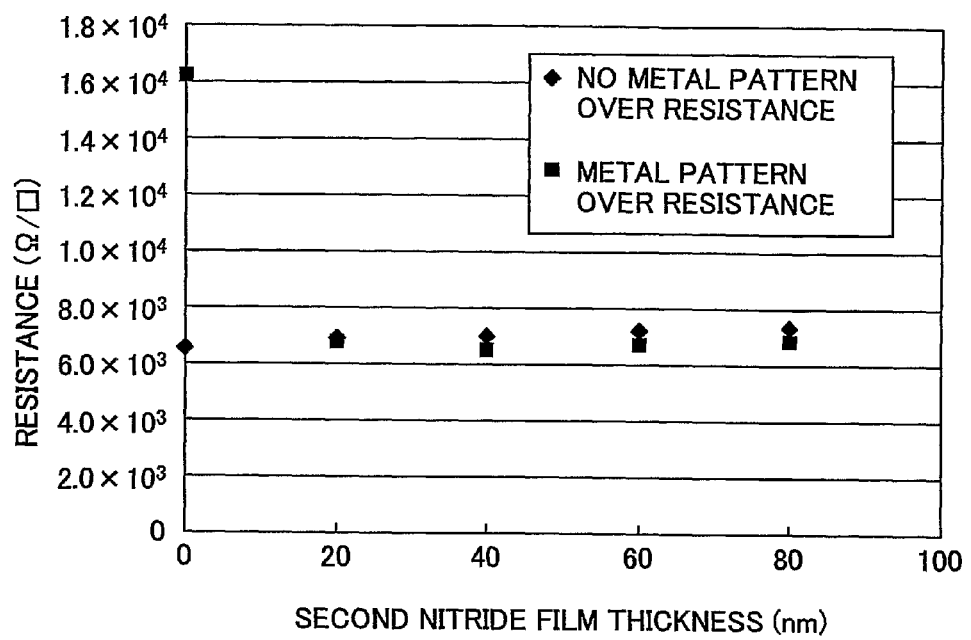
FIG. 3 is a diagram showing the change of resistance value of a polysilicon pattern with thickness of a second nitride film while maintaining the thickness of 20 nm for the first nitride film for both of the cases in which there is provided a metal interconnection layer pattern on a polysilicon pattern and in which no such a metal interconnection layer pattern is provided on the polysilicon pattern.

FIG. 3 shows the change of resistance of the polysilicon pattern 23 in the structure in which the polysilicon pattern 23 is covered by the first nitride film 29 of the thickness of 20 nm while changing the thickness of the second nitride film 33, for the case in which the metal interconnection pattern 31 is provided over the polysilicon pattern 23 and for the case no such a metal interconnection pattern is provided. In FIG. 3, it should be noted that the vertical axis represents the resistivity represented in terms of $\Omega/\square$ while the horizontal axis represents the thickness of the second nitride film 33 in terms of nanometers.

Referring to FIG. 3, it can be seen that there exists a large difference between the case in which no metal interconnection layer pattern 31 is provided and the case in which the metal interconnection layer pattern 31 is provided in the conventional art where the second nitride film 33 is not provided (0 nm thickness for the second nitride film 33), in that the polysilicon pattern 23 shows a resistance value of 7000 $\Omega/\square$ when there is no metal interconnection pattern 31 and a resistance value of 1600 $\Omega/\square$ when such a metal interconnection layer pattern 31 is provided. On the other hand, FIG. 3 also shows that, when the second nitride film 33 is formed with the thickness of 20 nm or more, the same resistance value is obtained in both of these cases.

From this result, it is clearly seen that the same resistance value is obtained for a polysilicon pattern irrespective of whether or not there is disposed a metal interconnection layer pattern over the polysilicon pattern, by covering the metal interconnection layer pattern provided on the interlayer insulation film over the polysilicon pattern by a silicon nitride film.

Thus, according to the present invention, it becomes possible to dispose a metal interconnection layer pattern over a polysilicon pattern while controlling the resistance of the polysilicon pattern to a desired value.

Figure 4:
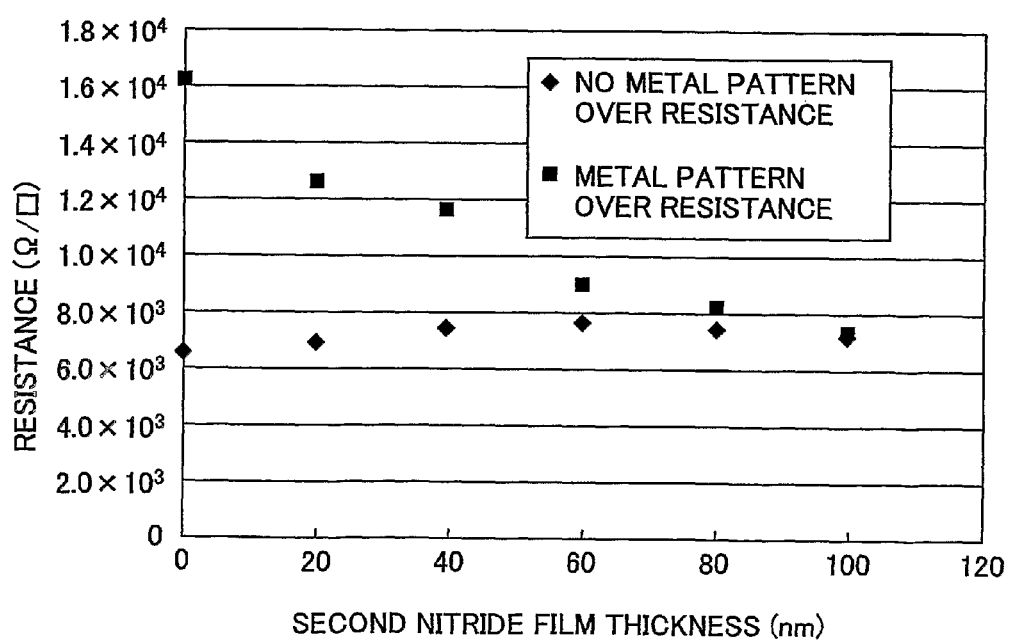
FIG. 4 is a diagram showing the change of resistance value of a polysilicon pattern with thickness of a second nitride film while maintaining the thickness of 5 nm for the first nitride film for both of the cases in which there is provided a metal interconnection layer pattern on a polysilicon pattern and no such a metal interconnection layer pattern is provided on the polysilicon pattern.

FIG. 4 shows the change of resistance of the polysilicon pattern 23 in the structure in which the polysilicon pattern 23 is covered by the first nitride film 29 of the thickness of 5 nm while changing the thickness of the second nitride film 33, for the case in which the metal interconnection pattern 31 is provided over the polysilicon pattern 23 and for the case no such a metal interconnection pattern is provided. In FIG. 4, it should be noted that the vertical axis represents the resistivity represented in terms of $\Omega/\square$ while the horizontal axis represents the thickness of the second nitride film 33 in terms of nanometers.

From FIG. 4, it is indicated that the resistance of the polysilicon pattern is not affected when the thickness of the second nitride film 33 is 60 nm or more and the polysilicon pattern shows the same resistance value irrespective of whether or not the metal interconnection layer pattern 31 is disposed over the polysilicon pattern 33.

Figure 5:
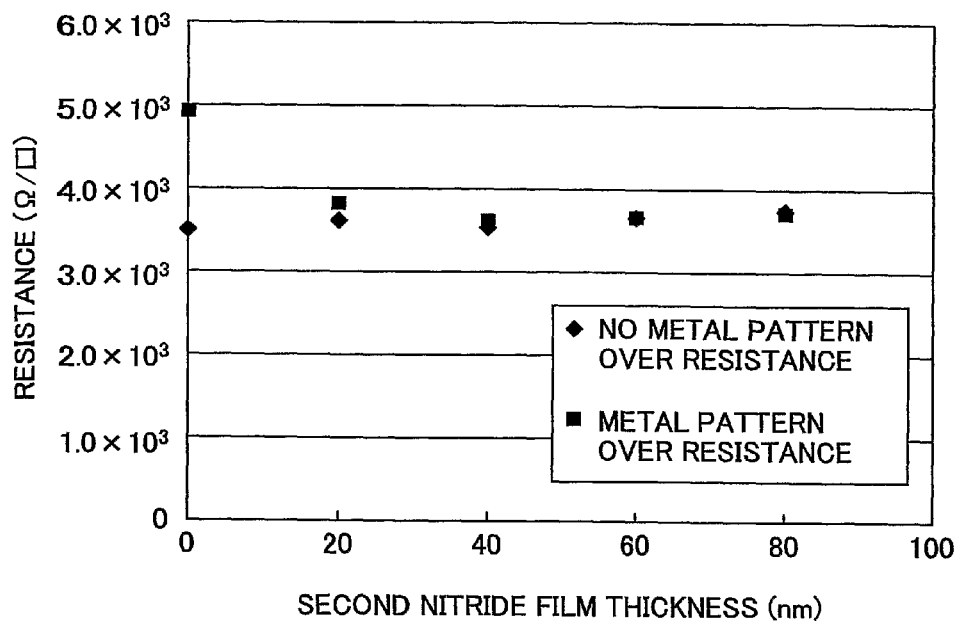
FIG. 5 is a diagram showing the resistance change of the polysilicon pattern with film thickness of the second nitride film under the same condition to FIG. 3, except that the resistance value of the polysilicon pattern is reduced as compared with the case of FIG. 3.

FIG. 5 shows the change of resistance of the polysilicon pattern for various thicknesses of the second nitride film 33 under the same condition of FIG. 3 except that the resistance value of the polysilicon pattern 23 is decreased. In FIG. 5, the horizontal axis represents the thickness of the second nitride film 33 in terms of nanometers while the vertical axis represents the resistance of the polysilicon pattern 23 represented in terms of $\Omega/\square$.

From FIG. 5, it can be seen that the resistance value of the polysilicon pattern 23 is not influenced by the existence or non-existence of the overlying metal interconnection layer pattern 31 when the second nitride film 33 is formed with the thickness of 60 nm or more.

Figure 6:
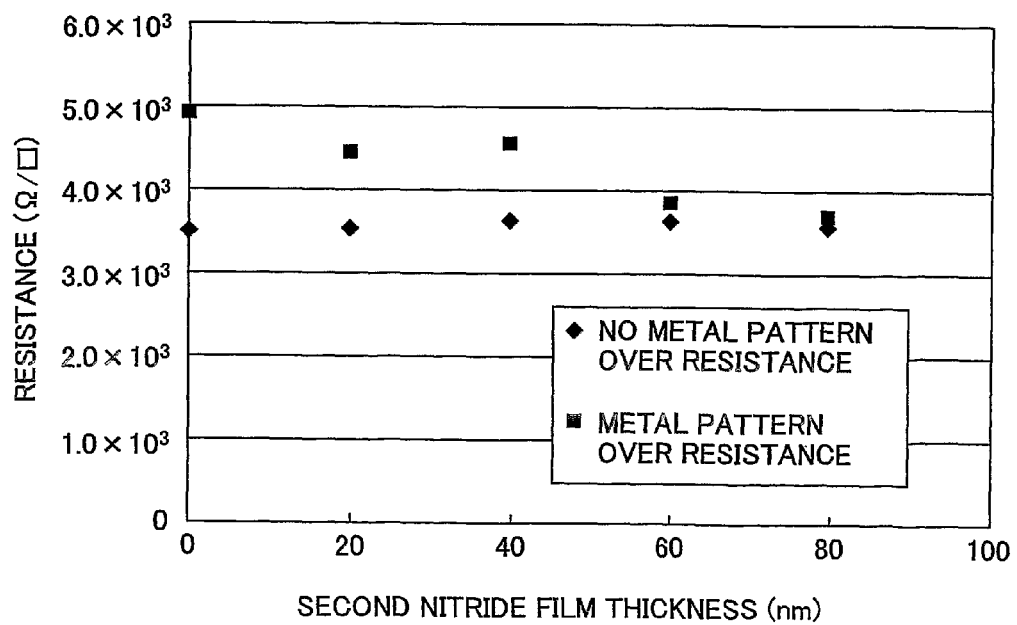
FIG. 6 is a diagram showing a change of resistance value of the polysilicon pattern with change of film thickness of the second nitride film under the same conduction to FIG. 4, except that the resistance value of the polysilicon pattern is reduced as compared with the case of FIG. 4.

FIG. 6 shows the change of resistance of the polysilicon pattern 23 for various thicknesses of the second nitride film under the condition identical to the case of FIG. 4 except that the resistance value of the polysilicon pattern 23 is reduced as compared with the case of FIG. 4, wherein the horizontal axis represents the thickness of the second nitride film 33 in terms of nanometers while the vertical axis represents the resistance of the polysilicon pattern 23 represented in terms of Ω/□.

From FIG. 6, it will be noted that the resistance of the polysilicon pattern 23 is not influenced by the metal interconnection layer pattern above and takes more or less the same value, provided that the second nitride film 33 has a thickness of 80 nm or more.

Thus, with the present embodiment, it becomes possible to achieve the same resistance value for various polysilicon patterns irrespective of whether or not there is disposed a metal interconnection layer pattern over the polysilicon pattern, by changing the thickness of the first nitride film and the second nitride film. As a result, it becomes possible to dispose the metal interconnection layer pattern freely over the substrate while controlling the resistance value of the polysilicon resistance pattern as desired.

Second Embodiment

Figure 7:
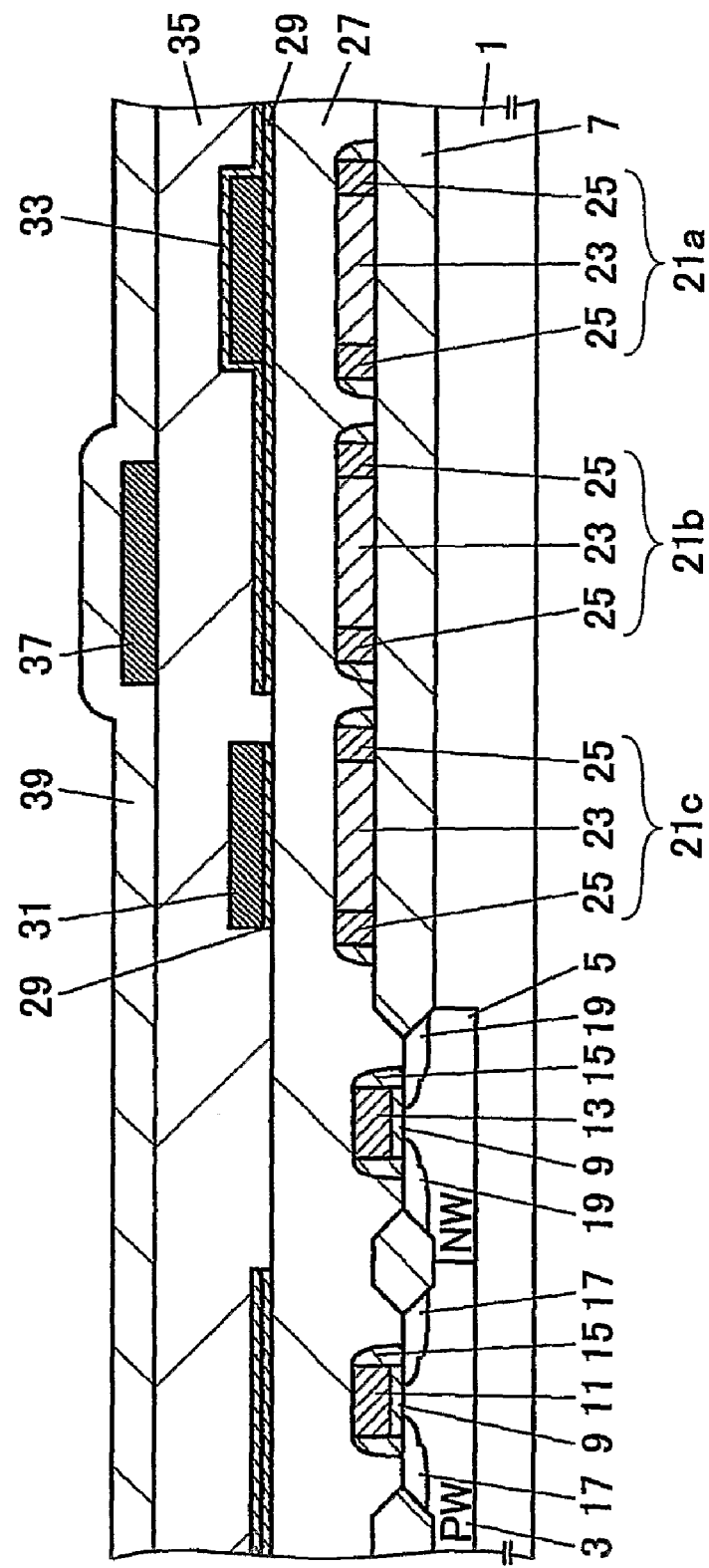
FIG. 7 is a cross-sectional diagram showing a further embodiment of the semiconductor device of the present invention.

FIG. 7 is a cross-sectional diagram showing a semiconductor device according to a second embodiment of the present invention, wherein those parts corresponding to the parts described previously are designated by the same reference numerals and the description thereof will be omitted.

With the present embodiment, it will be noted that there are provided three resistance elements 21a, 21b and 21C each having a structure identical to the resistance element 21, on the device isolation film 7.

Further, two metal interconnection layer patterns 31 are formed respectively over the resistance element 21a and the resistance element 21c via the interlayer insulation film 27 and the first nitride film 29.

In FIG. 7, it should be noted that the second nitride film 33 is formed on the first nitride film 29 over the part of the interlayer insulation film 27 including the part where the first metal interconnection layer pattern 31 is formed. On the other hand, the first nitride film 29 and the second nitride film 33 are removed from the surface of the interlayer insulation film 27 in the region over the resistance element 21c, except for the first nitride film 29 formed right underneath the first metal interconnection layer pattern 29. Further, it is noted that the first nitride film 29 and the second nitride film 33 are removed from the region over the p-channel MOS transistor.

With the present embodiment, in which the first nitride film 29 and the second nitride film 33 are removed from the region over the p-channel MOS transistor, it becomes possible to stabilize the trapping levels existing at the gate oxide interface of the p-channel MOS transistor. Thereby degradation of controllability of threshold characteristics is avoided for the p-channel MOS transistor.

Figure 8:
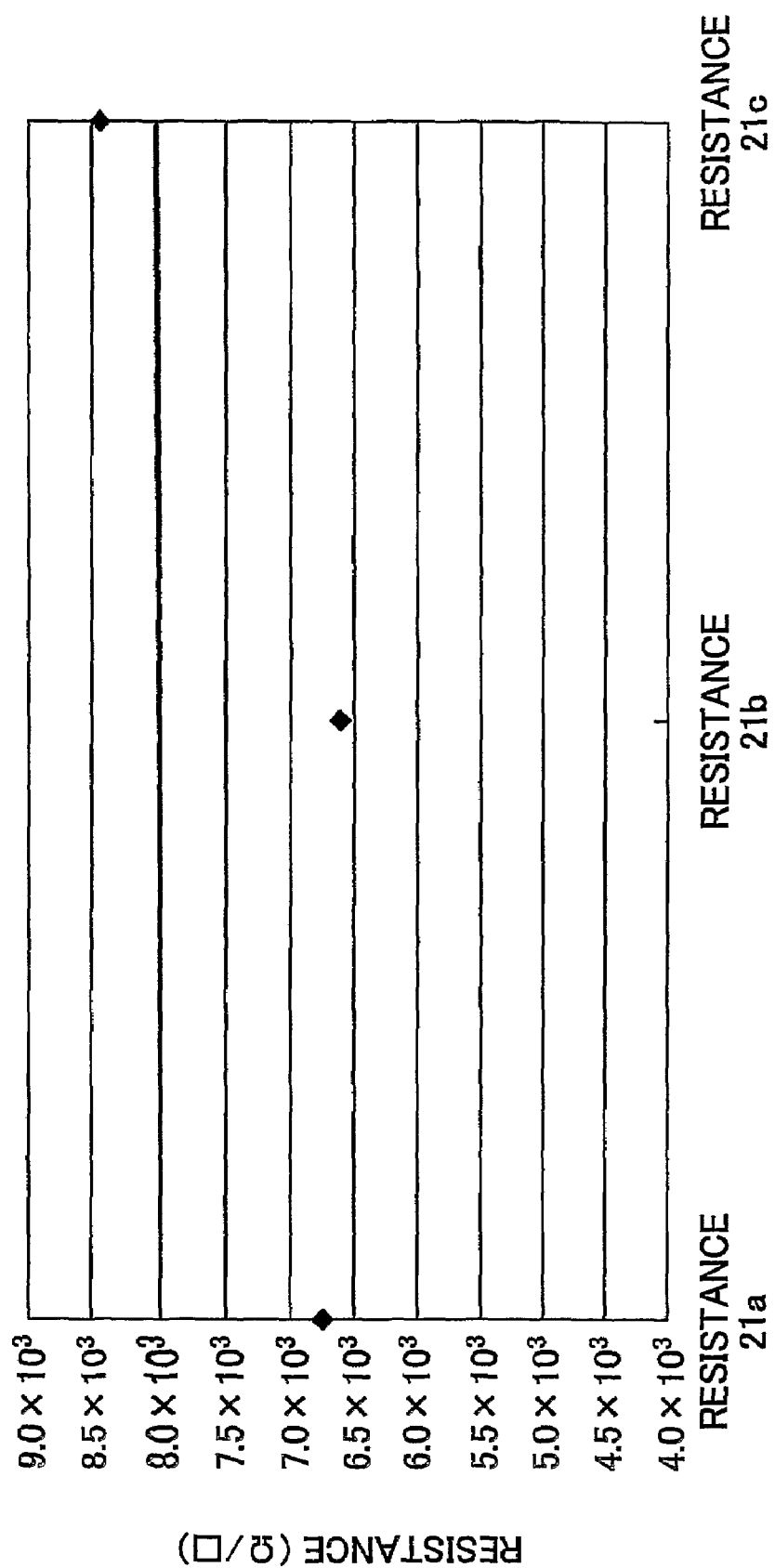
FIG. 8 is a diagram showing the resistance value of a resistance body 23 constituting the resistance elements 21a, 21b and 21c of FIG. 7.

FIG. 8 is a diagram showing the resistance value of the polysilicon pattern 23 for the resistance elements 21a, 21b and 21c of FIG. 7, wherein the horizontal axis represent the resistance elements 21a, 21b and 21c while the vertical axis represents the resistance value of the respective polysilicon patterns in terms of Ω/□.

Because the first nitride film 29 and the second nitride film 33 around the first interconnection layer 31 are removed in the vicinity of the first metal interconnection layer pattern 31 over the resistance element 21c except for the first nitride film 29 right underneath the first metal interconnection layer pattern 31 with such a construction, it becomes possible to change the resistance value for the polysilicon resistance body 23 constituting the resistance element 21c, even when the polysilicon pattern 23 of the resistance element 21c has the same impurity concentration level with the polysilicon patterns 23 of the resistance elements 21a and 21b.

Figure 9:
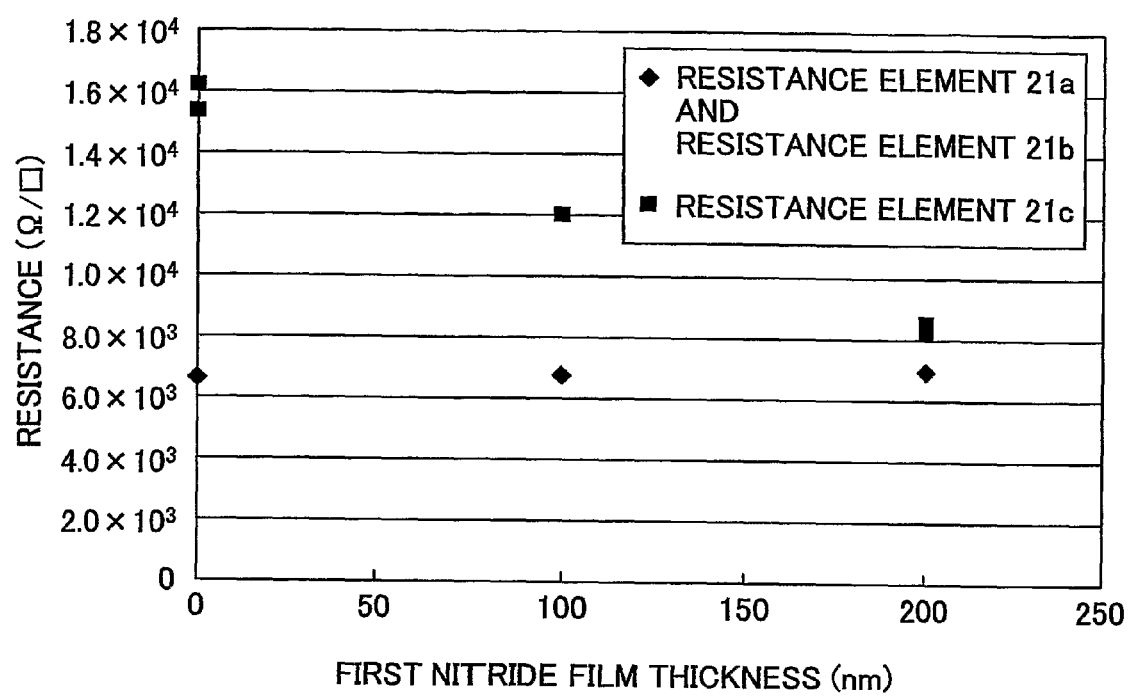
FIG. 9 is a diagram showing the resistance value of the resistance body 23 of any of the resistance elements 21a, 21b and 21c of FIG. 7 for the case of changing the film thickness of the first nitride film 29.

FIG. 9 shows the resistance of the polysilicon resistance body 23 for the resistance elements 21a, 21b and 21c of FIG. 7 for the case of changing the thickness of the first nitride film 29, wherein the horizontal axis represents the thickness of the first nitride film 29 while the vertical axis represents the resistance value of the polysilicon resistance body 23 in terms of Ω/□.

By changing the thickness of the first nitride film 29, it is possible to change the resistance of the resistance element 21c selectively while maintaining the same resistance value for the resistance elements 21a and 21b.

It should be noted that the semiconductor device according to the embodiment of FIG. 7 can be formed by selectively removing the second nitride film 33 and the first nitride film 29 by photolithography and etching after forming the second nitride film 33 in the step of FIG. 2E for forming the second nitride film 33 but before the step of forming the interlayer insulation film 35 thereon.

Third Embodiment

Figure 10:
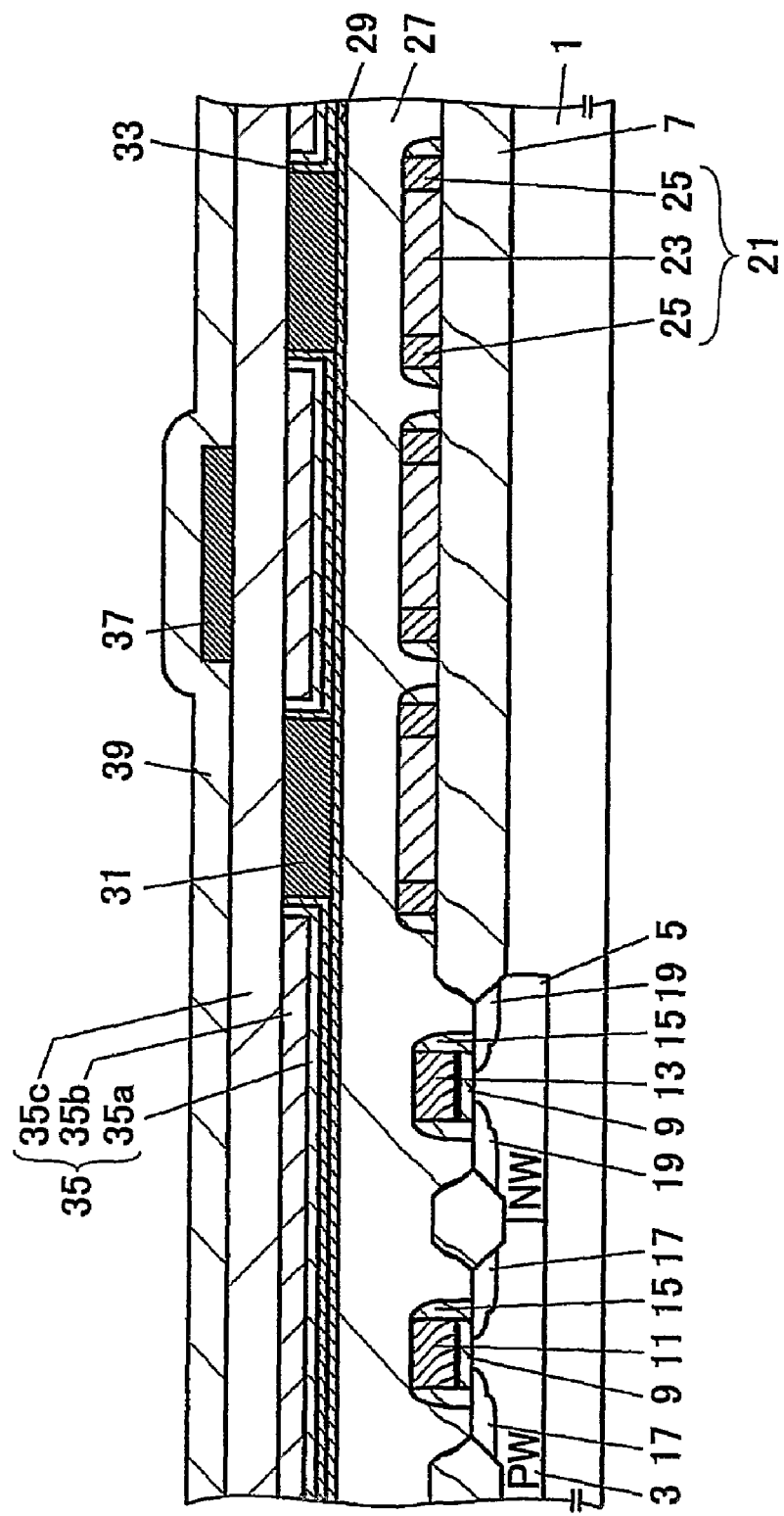
FIG. 10 is a cross-sectional diagram showing a further embodiment of the semiconductor device of the present invention.

FIG. 10 is a cross-sectional diagram showing a semiconductor device according to a third embodiment of the present invention, wherein those parts corresponding to the parts described previously are designated by the same reference numerals and the description thereof will be omitted.

In the present embodiment, the interlayer insulation film 35 has a laminated structure laminating consecutively a TEOS film 35a, an SOG film 35b and a TEOS film 35c from the bottom side to the top side of the film 35, wherein it should be noted that the second nitride film 33 covering the top surface of the first metal interconnection layer pattern 31 is removed with the present embodiment. Removal of the second nitride film 33 can be achieved at the time of etchback process of the SOG film 35.

With this embodiment, in which the SOG film 35b is removed from the top surface of the first metal interconnection layer pattern 31, it becomes possible to form the throughholes for electrically interconnecting the first metal interconnection layer pattern 31 to the second metal interconnection layer pattern 37 with certainty, and poor electrical contact between the first metal interconnection layer pattern 31 and the second metal interconnection layer pattern 37 can be prevented. Further, planarization of the interlayer insulation film 35 is improved.

Further, because of existence of the first nitride film 29 underneath the first metal interconnection layer pattern 31, modification of the resistance value of the polysilicon resistance body 23 or variation of the threshold voltage of the MOS transistor is prevented effectively. Further, because it is possible to control the thickness of the first nitride film 29 and the second nitride film 33 independently, it is possible to optimize the film thicknesses of the first and second nitride films 29 and 33 in conformity with the desired resistance value of the polysilicon resistance body 23.

Further, it is possible with the present embodiment to remove the first nitride film 29 and the second nitride film selectively similarly to the embodiment explained with reference to FIG. 7. With this, the same effect explained with reference to FIG. 7 is attained.

Fourth Embodiment

Figure 11:
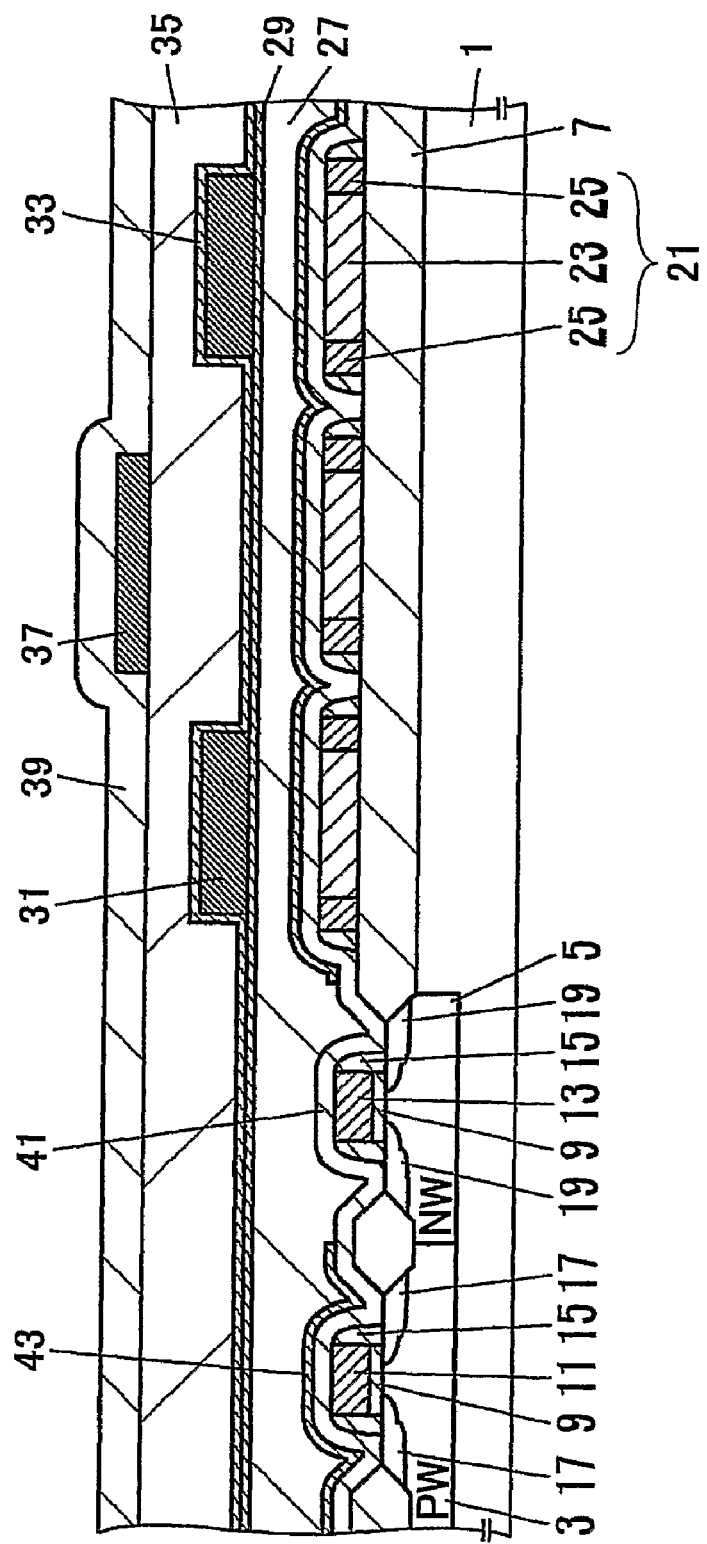
FIG. 11 is a cross-sectional diagram showing a further embodiment of the present invention.

FIG. 11 is a cross-sectional diagram showing a semiconductor device according to a fourth embodiment of the present invention, wherein those parts described previously are designated by the same reference numerals and the description thereof will be omitted.

With this embodiment, there is formed a thermal oxide film 41 of the thickness of 5-80 nm on the resistance element 21 and the p-channel and n-channel MOS transistors. Further, there is formed a third nitride film 43 of the thickness of 5-30 nm on thermal oxide film 41 so as to cover the resistance element 21 and the n-channel MOS transistor, wherein formation of the third nitride film 43 is not made on the region where the p-channel MOS transistor is formed. This, however, does not mean that formation of the third nitride film 43 is prohibited on the p-channel MOS transistor and it is possible to form the third nitride film 43 also over the p-channel MOS transistor.

With the present embodiment, it becomes possible to suppress the diffusion of hydrogen molecules to the polysilicon gate electrode 11 of $n^+$-type or the polysilicon gate electrode 13 of $p^+$-type and to the polysilicon resistance body 23 with the formation of the third nitride film 32, and stability of resistance value is improved for the polysilicon pattern.

Further, because the third nitride film 43 is not formed on the p-channel MOS transistor, formation of trapping levels for the p-channel transistor is stabilized and there occurs no degradation in the controllability8 of threshold voltage of the p-channel MOS transistor.

Further, with the present embodiment, it is possible to configure such that the first nitride film 29 and the second nitride film 33 are removed from a predetermined region similarly to the second embodiment explained with reference to FIG. 7. With this, the effect similar to that of the embodiment of FIG. 7 is attained also with the present embodiment.

Fifth Embodiment

Figure 12:
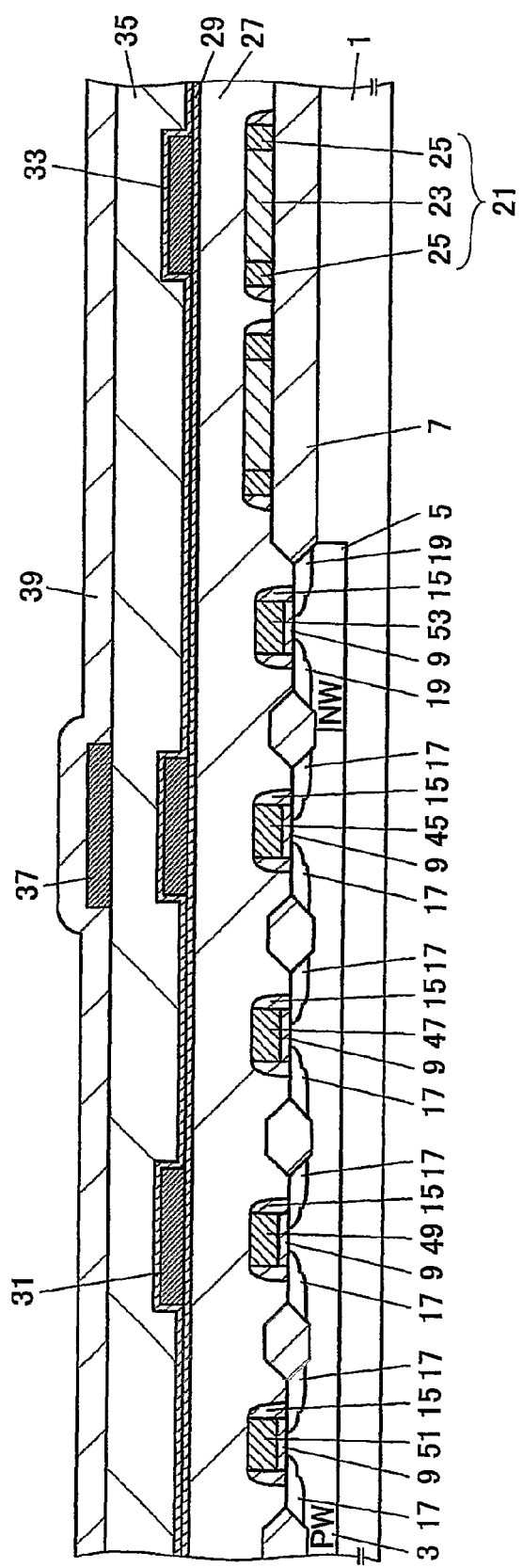
FIG. 12 is a cross-sectional diagram showing a further embodiment of the present invention.

FIG. 12 is a cross-sectional diagram showing a fifth embodiment of the present invention, wherein those parts explained previously with reference to FIG. 1 are designated by the same reference numerals and the description thereof will be omitted.

In the p-type well region 3, there are provided four MOS transistor regions each formed with a pair of n-type diffusion regions 17. Further, there are provided, between respective pairs of the diffusion regions 17, a gate electrode 45 of $n^-$-type doped with P, a gate electrode 47 of $n^-$-type doped with P, a gate electrode 49 of $n^+$-type doped with P and a gate electrode 49 of $p^-$-type doped with B, via the respective gate oxide films 9. In a typical example, the impurity concentration of the gate electrodes 45, 47, 49 and 51 are set respectively to $7\times10^{18}$-$5\times10^{19}$/cm$^3$, $7\times10^{18}$-$5\times10^{19}$/cm$^3$, $2\times10^{19}$-$1\times10^{20}$/cm$^3$ and $1\times10^{18}$-$2\times10^{19}$/cm$^3$.

Further, there is formed a pair of p-type diffusion regions 19 in the n-type well region 5, and a gate electrode 53 of $n^+$-type doped with P is formed between the diffusion regions 19 via the gate oxide film 9. The gate electrode 53 may be doped to the concentration level of $1\times10^{20}$/cm$^3$ or more.

By setting the impurity concentration level to be identical with each other for the channel regions of these transistors, it becomes possible to realize a voltage generator circuit of reduced variation in the temperature characteristics and threshold voltage, by utilizing the difference of work function reflecting the difference of the impurity concentration level in the gate electrodes.

Figure 13:
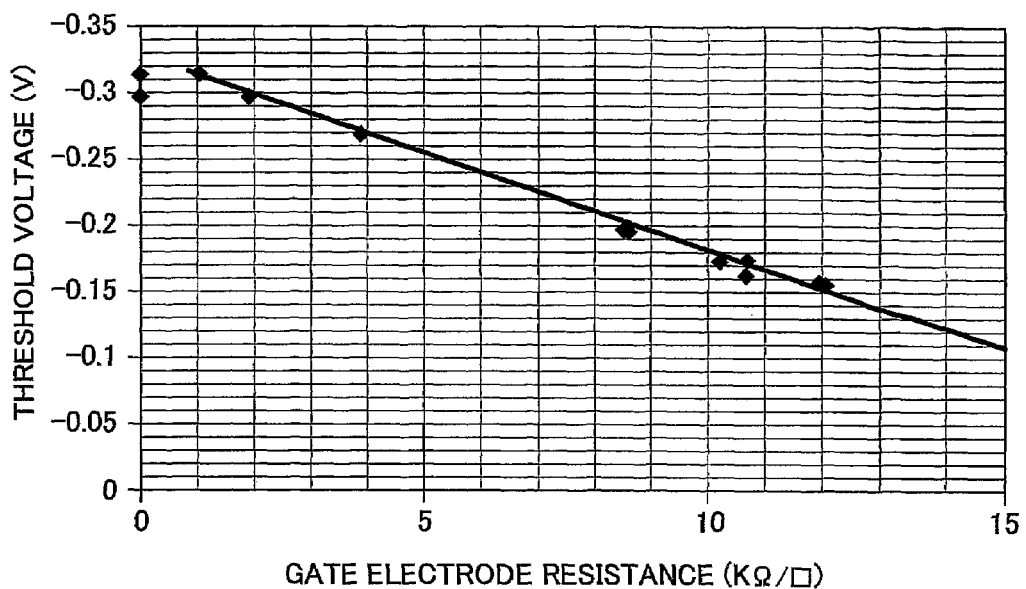
FIG. 13 is a diagram showing the relationship between the resistance value of gate electrode of an n-channel MOS transistor having a gate electrode doped with P and the threshold voltage of such n-channel MOS transistor.

FIG. 13 shows the relationship between the resistance of the gate electrode and the threshold voltage for the n-channel MOS transistor having a gate electrode doped with P. In FIG. 13, the horizontal axis represents the resistance value of the gate electrode (kΩ/□) and the vertical axis represents the threshold voltage Vth(V).

Referring to FIG. 13, it will be noted that the change of the resistance value of gate electrode provides a profound effect on the threshold voltage of the n-channel MOS transistor.

With this embodiment, in which both the first nitride film 29 and the second nitride film 33 are formed similar to the embodiment of FIG. 1, it becomes possible to set the resistance values of the polysilicon patterns to be identical. Thus, it becomes possible to dispose the first metal interconnection layer patterns over the polysilicon patterns while controlling the resistance values of the polysilicon patterns.

Further, with this embodiment, it is possible to remove the first nitride film and the second nitride film 33 selectively from a predetermined region similarly to the embodiment explained with reference to FIG. 7. With this, the effect similar to the case of the embodiment of FIG. 7 is attained.

The metal thin-film resistance element constituting the semiconductor device of the present invention can be used for example in a semiconductor device having an analog circuit. Hereinafter, an embodiment of the semiconductor device having an analog circuit that uses such a metal thin-film resistance will be explained.

Figure 14:
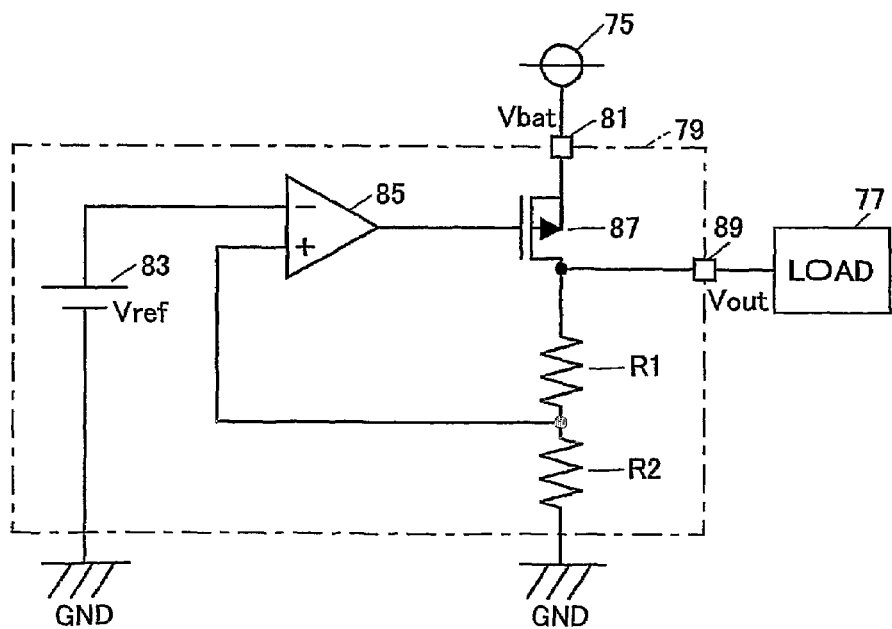
FIG. 14 is a circuit diagram showing an embodiment of a semiconductor device having a constant voltage generator circuit configured in the form of an analog circuit.

FIG. 14 is a circuit diagram showing an embodiment of the semiconductor device having an analog circuit that forms a constant voltage generator.

Referring to FIG. 14, there is provided a constant voltage generator 79 for supplying a stabilized power from a D.C. power supply 75 to a load 77. Thereby, it should be noted that the constant voltage generator 79 includes: an input terminal (Vbat) 81 to which the D.C. power supply 75 is connected; a reference voltage generator (Vref) 83; an operational amplifier (comparator) 85, a p-channel MOS transistor (designated hereinafter as PMOS) 87 constituting an output driver; voltage dividers R1 and R2; and an output terminal (Vout) 39.

In the operational amplifier 85 of the constant voltage generator 79, the output terminal thereof is connected to the gate electrode of the PMOS 87 and the reference voltage Vref of the reference voltage generator 83 is supplied to an inversion input terminal (−) thereof. Further, a voltage obtained by dividing the output voltage Vout by the resistance elements R1 and R2 is supplied to the non-inversion input terminal (+) thereof, and the voltage dividend out by the resistance elements R1 and R2 is controlled to be equal to the reference voltage Vref.

Figure 15:
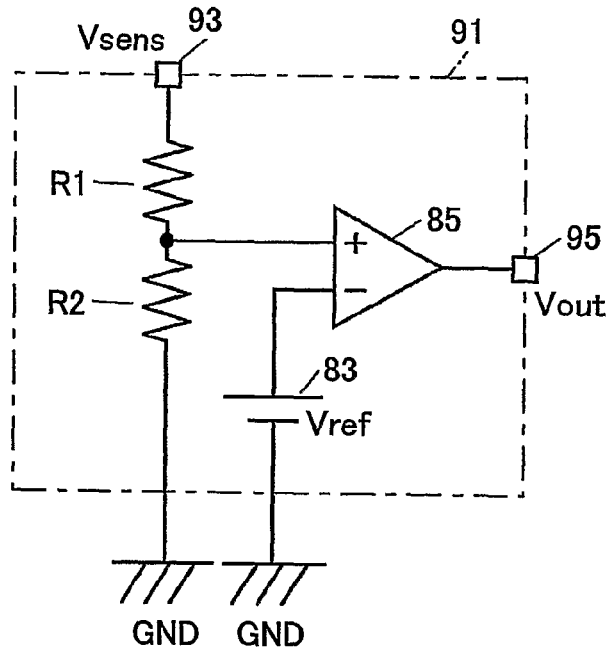
FIG. 15 is a circuit diagram showing an embodiment of the semiconductor device having a voltage detection circuit configured in the form of an analog circuit.

FIG. 15 is a circuit diagram showing an embodiment of the semiconductor device having an analog voltage detector.

Referring to FIG. 15, the voltage detector 91 includes an operational amplifier 85 having an inversion input terminal (−) connected to a reference voltage gubernator 83, wherein the inversion input terminal is supplied with a reference voltage Vref from the reference voltage generator 83. Further, the voltage of an input terminal 93 supplied for voltage detection is divided by the resistances R1 and R2 and the divided voltage is supplied to a non-inversion input terminal (+) of the operational amplifier 85. The output of the operational amplifier 85 is output via an output terminal (Vout) 95.

In such a voltage detector 91, it should be noted that the output of the operational amplifier 85 maintains a high level state (H) in the case the input voltage of the input terminal for voltage detection is high and the divided voltage divided out by the resistances R1 and R2 is higher than the reference voltage Vref. On the other hand, when the voltage to be measured has dropped and the voltage divided by the resistance elements R1 and R2 has decreased below the reference voltage Vref, the output of the operational amplifier 85 turns to the low level state (L).

Generally, the constant voltage generator of FIG. 14 or the voltage detector of FIG. 15 adjusts the resistance value of the resistance elements constituting the voltage divider by using an adjustable resistance circuit (called voltage divider) capable of changing the resistance value thereof by fuse elements constituting the voltage divider, in view of variation of the reference voltage Vref of the reference voltage generator caused by the variation at the time of the fabrication process.

Figure 16:
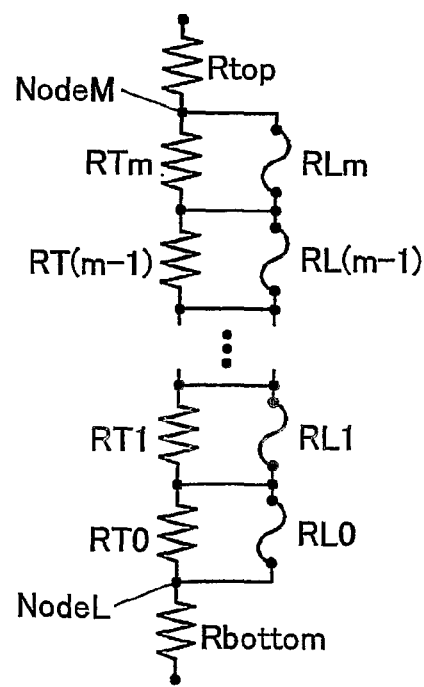
FIG. 16 is a circuit diagram showing an embodiment of the semiconductor device having a voltage divider circuit configured in the form of an analog circuit.

FIG. 16 is a circuit diagram showing an example of the voltage divider circuit to which the thin-film resistance element of the present invention is applied. Further, FIGS. 17 and 18 are layout diagrams showing the examples of layout of the voltage divider circuit, wherein FIG. 17 shows the layout example for the part where the fuse elements are formed while FIG. 18 shows the layout example where there are formed resistance elements.

Referring to FIG. 16, the voltage divider circuit includes m+1 (m being a positive integer) resistance elements RT0, RT1, . . . RTm connected in series between a resistance element Rbottom and a resistance element Rtop, wherein there are provided fuse elements RL0, RL1, . . . RLm parallel to the respective resistance elements RT0, RT1, . . . RTm.

Figure 17:
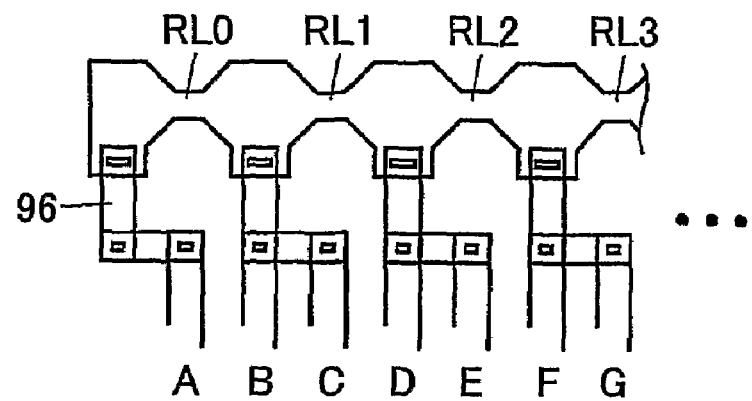
FIG. 17 is a layout diagram showing an example of layout of the fuse element part of the voltage divider circuit.
Figure 18:
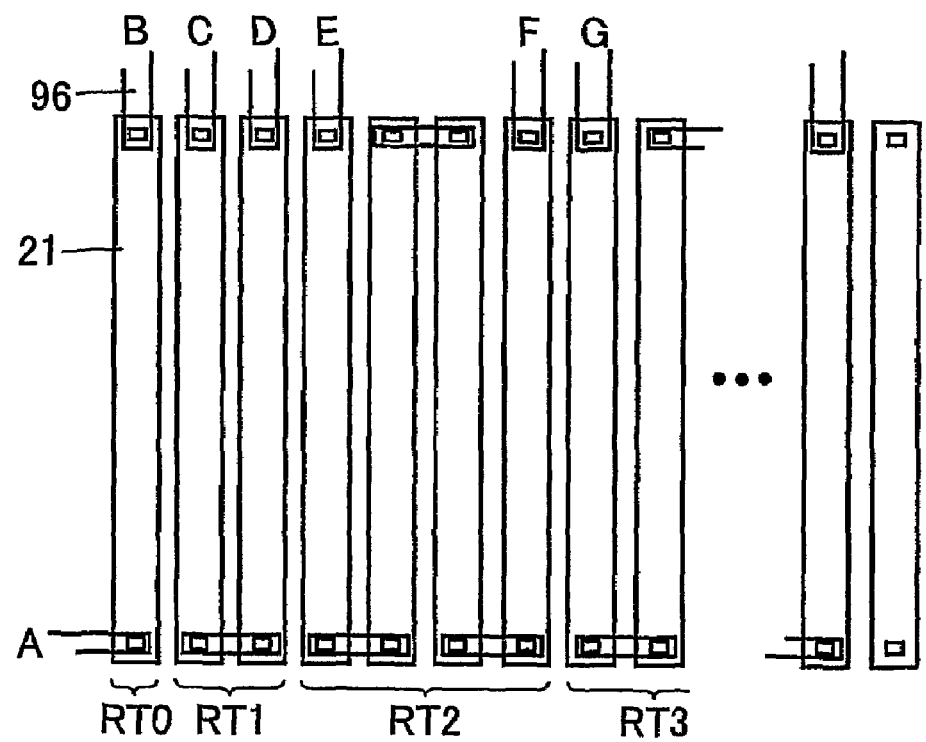
FIG. 18 is a layout diagram showing an example of layout of the metal thin-film resistance part of the voltage divider circuit.

As shown in FIG. 17, the fuse elements RL0, RL1, . . . RLm are formed of a polysilicon pattern having a resistance value of 20-40Ω. Thereby, the resistance values of the resistance elements RT0, RT1, . . . RTm are set to increase, in the direction from the resistance element Rbottom to the resistance element Rtop, with a multiple of the numeral two. Thus, the resistance value of the resistance element RTn takes the value 2n times larger than the resistance value of the resistance element RT0.

For example, the voltage divider circuit is formed by using the resistance elements 21 such that a single resistance element 21 forms the resistance element RT0. Thereby, the resistance element RTn is formed by 2n resistance elements 21. For the resistance element 21, the resistance elements explained with the preceding embodiments can be used.

In FIGS. 17 and 18, it should be noted that the part between A and A, the part between B and B, the part between C and C, the part between D and D, the part between F and F and the part between G and G are connected electrically by using a metal interconnection pattern 96.

In a voltage divider circuit in which the ratio of resistance value between resistance elements is important, each resistance element is combined with a fuse element to form a unit resistance element and the voltage divider circuit is formed by connecting plural unit resistance elements in series, wherein the unit resistance elements thus connected in series are disposed on the semiconductor substrate in a ladder form.

With the voltage divider circuit of such a construction, it is possible to achieve a desired resistance value by disconnecting the fuse elements RL0, RL1, . . . RLm by a laser beam as necessary.

With the semiconductor device of the present invention, it becomes possible to dispose the metal interconnection layer patterns over the polysilicon patterns freely while controlling the resistance value of the polysilicon patterns and the degree of freedom of design of the semiconductor device is improved significantly.

In the case of applying the voltage divider circuit of FIG. 16 to the resistor elements R1 and R2 of the constant voltage generator 79 of FIG. 14, an end of the resistance element Rbottom is grounded and an end of the resistance element Rtop is connected to the drain of the PMOS 87. Further, the node NodeL between the resistance element Rbottom and the fine adjustment resistance element 99 or the node NodeM between the resistance element Rtop and the coarse adjustment resistance element 97 is connected to the non-inverting input terminal of the operational amplifier 85.

Because the degree of freedom of the voltage divider circuit is improved by applying the metal thin-film resistance and the laser beam interruption film to the resistance elements R1 and R2 of the voltage divider, it becomes possible to stabilize the output voltage of the constant voltage generator 79.

In the case of applying the voltage divider circuit of FIG. 16 to the resistor elements R1 and R2 of the voltage detector 91 shown in FIG. 15, an end of the resistance element Rbottom is grounded and an end of the resistance element Rtop is connected to the input terminal 93. Further, the node NodeL between the resistance element Rbottom and the fine adjustment resistance element 99 or the node NodeM between the resistance element Rtop and the coarse adjustment resistance element 97 is connected to the non-inverting input terminal of the operational amplifier 85.

Because the degree of freedom of design is improved for the voltage divider circuit with the voltage divider circuit according to the present invention, it becomes possible to increase the degree of freedom of design of the voltage detection circuit 91.

While description has been made with reference to FIGS. 14-17 with regard to the example of the semiconductor device having a voltage divider to which the voltage divider circuit that uses polysilicon patterns constituting the semiconductor device is applied, the semiconductor device applied with such a voltage divider circuit is not limited to the semiconductor device having a constant voltage generator or the semiconductor device having a voltage detector, but the present invention can be applied to any semiconductor device having a voltage divider circuit.

Further, the semiconductor device applied with the polysilicon pattern constituting the present invention is by no means limited to the semiconductor device having a voltage divider circuit, but the present invention is applicable to any semiconductor device having a metal thin-film resistance.

Further, the present invention is by no means limited to the embodiments described heretofore, but various variations and modifications may be made without departing from the scope of the invention. It should be noted that the size, shape, material and arrangement explained heretofore are merely for the purpose of example.

The invention claimed is:

1. A semiconductor device, comprising:
a semiconductor substrate;
a polysilicon pattern formed on said semiconductor substrate via an insulation film, wherein said polysilicon pattern includes at least one doped gate electrode and at least one doped resistance element;
an interlayer insulation film formed on said semiconductor substrate so as to cover said polysilicon pattern;
a first silicon nitride film formed on said interlayer insulation film;
a metal interconnection layer pattern formed directly on said first silicon nitride layer; and
a second silicon nitride film formed directly on a top surface and sidewall surfaces of said metal interconnection layer pattern,
wherein said metal interconnection layer pattern is not an uppermost metal interconnection layer pattern.

2. The semiconductor device as claimed in claim 1, wherein said first nitride film and said second nitride film have respective, different thicknesses.

3. The semiconductor device as claimed in claim 1, further comprising a region wherein said first silicon nitride film and said second silicon nitride film are removed except for said first silicon nitride film underlying said metal interconnection layer pattern.

4. The semiconductor device as claimed in claim 1, further comprising a p-channel MOS transistor having a gate electrode formed of said polysilicon pattern, wherein formation of said metal interconnection layer pattern, said first silicon nitride film and said second silicon nitride film are suppressed in a region over said p-channel MOS transistor.

5. The semiconductor device as claimed in claim 1, further comprising a laminated film formed between said polysilicon pattern and said interlayer insulation film, said laminated film comprising consecutive lamination of an oxide film and a third silicon nitride film in a direction from said polysilicon pattern to said interlayer insulation film.

6. The semiconductor device as claimed in claim 5, further comprising a p-channel MOS transistor having a gate electrode of said polysilicon pattern, wherein said third silicon nitride film is formed over said p-channel MOS transistor.

7. A semiconductor device having a voltage divider circuit producing an output voltage by dividing a voltage supplied thereto,
    said voltage divider circuit comprising two or more resistance elements, said output voltage of said voltage divider being adjustable by disconnection of a fuse element,
    said resistance elements comprising a doped portion of a polysilicon pattern formed on a semiconductor substrate via an insulation film,
    an interlayer insulation film being formed on said semiconductor substrate so as to cover said polysilicon pattern,
    a first silicon nitride film formed on said interlayer insulation film;
    a metal interconnection layer pattern being formed directly on said first silicon nitride layer; and
    a second silicon nitride film formed directly on a top surface and sidewall surfaces of said metal interconnection layer pattern,
    wherein said metal interconnection layer pattern is not an uppermost metal interconnection layer pattern.

8. A semiconductor device comprising:
    a voltage divider circuit dividing a voltage supplied thereto and producing an output voltage;
    a reference voltage generator supplying a reference voltage; and
    a comparator circuit comparing said output voltage of said voltage divider circuit with said reference voltage of said reference voltage generator,
    said voltage divider circuit comprising two or more resistance elements, said output voltage of said voltage divider being adjustable by disconnection of a fuse element,
    said resistance elements comprising a doped portion of a polysilicon pattern formed on a semiconductor substrate via an insulation film,
    an interlayer insulation film being formed on said semiconductor substrate so as to cover said polysilicon pattern,
    a first silicon nitride film formed on said interlayer insulation film;
    a metal interconnection layer pattern being formed directly on said first silicon nitride layer; and
    a second silicon nitride film formed directly on a top surface and sidewall surfaces of said metal interconnection layer pattern,
    wherein said metal interconnection layer pattern is not an uppermost metal interconnection layer pattern.

9. A semiconductor device, comprising:
    an output driver controlling an output of an input voltage;
    a voltage divider circuit dividing said output voltage and producing a divided voltage;
    a reference voltage generator producing a reference voltage; and
    a constant voltage generator having a comparator circuit comparing said divided voltage from said voltage divider circuit and said reference voltage from said reference voltage generator, said comparator circuit controlling said output driver in response to a result of comparison,
    said voltage divider circuit comprising two or more resistance elements, said output voltage of said voltage divider being adjustable by disconnection of a fuse element,
    said resistance elements comprising a doped portion of a polysilicon pattern formed on a semiconductor substrate via an insulation film,
    an interlayer insulation film being formed on said semiconductor substrate so as to cover said polysilicon pattern,
    a first silicon nitride film formed on said interlayer insulation film;
    a metal interconnection layer pattern being formed directly on said first silicon nitride layer; and
    a second silicon nitride film formed directly on a top surface and sidewall surfaces of said metal interconnection layer pattern,
    wherein said metal interconnection layer pattern is not an uppermost metal interconnection layer pattern.

10. A method of fabricating a semiconductor device, comprising the steps of:
    forming a polysilicon pattern on a semiconductor substrate via an insulation film, wherein said polysilicon pattern includes at least one doped gate electrode and at least one doped resistance element;
    forming an interlayer insulation film on the semiconductor substrate so as to cover the polysilicon pattern;
    forming a first nitride film on the interlayer insulation film;
    forming a metal interconnection layer pattern directly on the first nitride film; and
    forming a second nitride film directly on the metal interconnection layer pattern and on portions of the first nitride film that are not covered by the metal interconnection layer pattern,
    wherein said metal interconnection layer pattern is not an uppermost metal interconnection layer pattern.

11. The method as claimed in claim 10, further comprising the step, after said step of forming said second nitride film, of selectively removing said second nitride film and said first nitride film from a predetermined area.

* * * * *